(12) United States Patent
Wei

(10) Patent No.: US 12,293,798 B2
(45) Date of Patent: May 6, 2025

(54) APPARATUS WITH CIRCUIT MANAGEMENT MECHANISM AND METHODS FOR OPERATING THE SAME

(71) Applicant: Micron Technology, Inc., Boise, ID (US)

(72) Inventor: Meng Wei, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 215 days.

(21) Appl. No.: 17/875,827

(22) Filed: Jul. 28, 2022

(65) Prior Publication Data

US 2024/0038313 A1 Feb. 1, 2024

(51) Int. Cl.
*G11C 16/32* (2006.01)
*G11C 16/10* (2006.01)
*G11C 16/16* (2006.01)
*G11C 16/34* (2006.01)

(52) U.S. Cl.
CPC ........ *G11C 16/3495* (2013.01); *G11C 16/102* (2013.01); *G11C 16/16* (2013.01); *G11C 16/32* (2013.01)

(58) Field of Classification Search
CPC ... G11C 16/3495; G11C 16/102; G11C 16/16; G11C 16/32
USPC .......................................................... 365/201
See application file for complete search history.

(56) References Cited

U.S. PATENT DOCUMENTS

| 11,194,643 B1* | 12/2021 | Liang | G06F 11/076 |
| 2018/0307598 A1* | 10/2018 | Fischer | G06F 3/0679 |
| 2020/0411110 A1* | 12/2020 | Getreuer | G11C 16/0483 |

* cited by examiner

*Primary Examiner* — Alexander Sofocleous
*Assistant Examiner* — Tracy Hampton
(74) *Attorney, Agent, or Firm* — Perkins Coie LLP

(57) ABSTRACT

Disclosed herein are methods, apparatuses and systems related to adjusting operation of memory dies according to reliability measures determined in real-time. The apparatus may be configured to determine the reliability measures based on (1) initiating and completing a programming operation within respective timings following an erase operation and (2) reading the programmed data within a window from completing the programming operation.

16 Claims, 11 Drawing Sheets

APPARATUS WITH CIRCUIT MANAGEMENT MECHANISM AND METHODS FOR OPERATING THE SAME

TECHNICAL FIELD

The disclosed embodiments relate to devices, and, in particular, to semiconductor memory devices with circuit management mechanism and methods for operating the same.

BACKGROUND

Memory systems can employ memory devices to store and access information. The memory devices can include volatile memory devices, non-volatile memory devices (e.g., flash memory employing "NAND" technology or logic gates, "NOR" technology or logic gates, or a combination thereof), or a combination device. The memory devices utilize electrical energy, along with corresponding threshold levels or processing/reading voltage levels, to store and access data. However, the performance or characteristics of the memory devices change or degrade over time, usage, or environmental conditions. The change in performance or characteristics conflicts with the threshold or processing voltage levels over time, leading to errors and other performance issues. As such, reliability of memory devices (e.g., memory arrays) are measured/estimated and compared against a minimum threshold measure that corresponds to current and/or future performances. Memory devices failing to meet the minimum threshold measure can be disqualified from use, leading to lower yield during manufacturing and performance/reliability issues after deployment.

BRIEF DESCRIPTION OF THE DRAWINGS

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

DETAILED DESCRIPTION

Figure 1A:
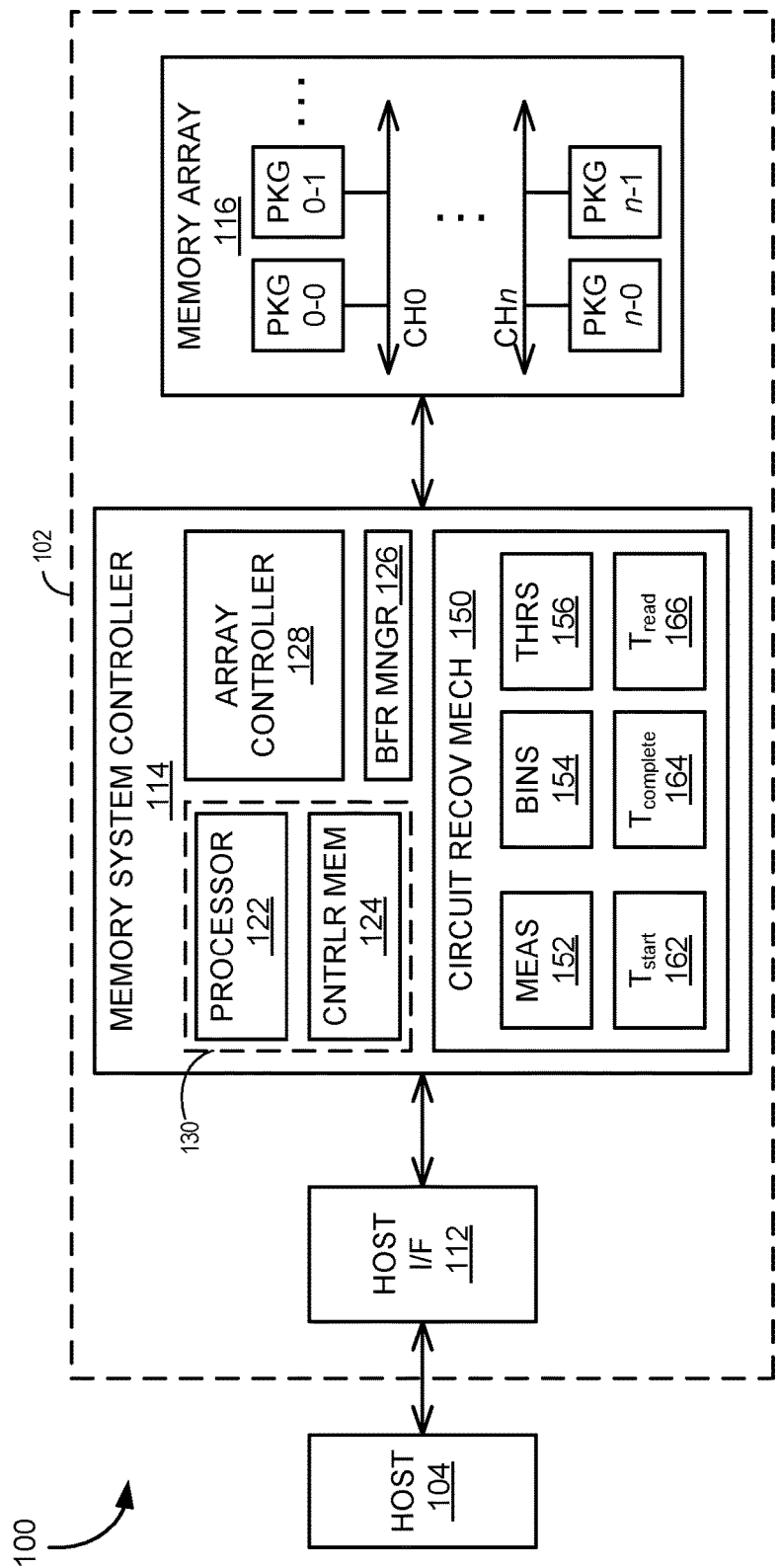
FIG. 1A is a block diagram of a computing system in accordance with an embodiment of the present technology.

As described in greater detail below, the technology disclosed herein relates to an apparatus, such as memory systems, systems with memory devices, related methods, etc., for classifying circuits according to reliability measures and controlling operations thereof based on such measures. The apparatus can use the classification and the control to utilize otherwise substandard (e.g., as defined by a reliability threshold) circuits.

For context, memory devices are held to strict reliability criteria. To ensure the targeted reliability, memory devices are often subjected to a qualification process during manufacturing (i.e., before deployment). During the qualification process, the reliability of memory components (e.g., memory arrays) are estimated or quantified and compared against a reliability threshold. Components that fail to meet the reliability threshold are disqualified/discarded from integration into final products (e.g., Solid-State Drive (SSD) system).

As technology advances, the desired capacity/density of the memory components are increasing. As result, the memory components may include increasing number of circuits (e.g., cells and/or layers) within a given set of dimensions. The increased density reduces the physical separations between the circuits (e.g., cell distance), which decreases Read Window Budget (RWB) needed to separate or distinguish between voltage levels (e.g., threshold voltage (Vt)). In other words, the decrease in the RWB corresponds to less margin or accuracy in accurately storing and reading the targeted bit values. Since, the RWB can be a key indicator used to measure the component reliability, the increase in density negatively affects the reliability measure of the memory components, decreases the yield rate, and increases the manufacturing cost.

Embodiments of the technology described herein can include a circuit management mechanism configured to bin the circuits (e.g., memory cells/blocks/dies) according to one or more reliability measures and manage operations of the binned circuits accordingly. For example, the memory system can include firmware that can scan (e.g., media scan) different level of components with different frequencies corresponding to the different bins. The memory system can track the reliability measures across deployment/usage (e.g., program-erase (P/E) cycles) and adjust the bin classifications accordingly. In some embodiments, the memory system can determine the reliability measures and identify the bin categorizations for memory cells based on erasing one or more memory blocks from each die, initiate programming of the erased block within a programming start time after the erase, complete all page programming within a programming completion time, and read predefined sample pages from the programmed block within a test read time. The strict timing parameters can cause the programmed cells to behave differently according to their circuit reliability. As such, the corresponding read results and the accuracy thereof can represent the reliability measure of the measured memory block.

The memory system can trigger the reliability determination during the lifecycle (e.g., deployment/operation). For example, the memory system can determine the reliability measure when a number of P/E cycles satisfy a predetermined trigger threshold. The memory system can examine a set of predetermined dies or dynamically selected dies.

Example Environment

FIG. 1 is a block diagram of a computing system 100 in accordance with an embodiment of the present technology. The computing system 100 can include a personal computing device/system, an enterprise system, a mobile device, a server system, a database system, a distributed computing system, or the like. The computing system 100 can include a memory system 102 coupled to a host device 104. The host device 104 can include one or more processors that can write data to and/or read data from the memory system 102. For example, the host device 104 can include an upstream central processing unit (CPU).

The memory system 102 can include circuitry configured to store data (via, e.g., write operations) and provide access to stored data (via, e.g., read operations). For example, the memory system 102 can include a persistent or non-volatile data storage system, such as a NAND-based Flash drive system, a SSD system, a SD card, or the like. In some embodiments, the memory system 102 can include a host interface 112 (e.g., buffers, transmitters, receivers, and/or the like) configured to facilitate communications with the host device 104. For example, the host interface 112 can be configured to support one or more host interconnect schemes, such as Universal Serial Bus (USB), Peripheral Component Interconnect (PCI), Serial AT Attachment (SATA), or the like. The host interface 112 can receive commands, addresses, data (e.g., write data), and/or other information from the host device 104. The host interface 112 can also send data (e.g., read data) and/or other information to the host device 104.

The memory system 102 can further include a memory system controller 114 and a memory array 116. The memory array 116 can include memory cells that are configured to store a unit of information. The memory system controller 114 can be configured to control the overall operation of the memory system 102, including the operations of the memory array 116.

In some embodiments, the memory array 116 can include a set of NAND Flash devices or packages. Each of the packages can include a set of memory cells that each store data in a charge storage structure. The memory cells can include, for example, floating gate, charge trap, phase change, ferroelectric, magnetoresitive, and/or other suitable storage elements configured to store data persistently or semi-persistently. The memory cells can be one-transistor memory cells that can be programmed to a target state to represent information. For instance, electric charge can be placed on, or removed from, the charge storage structure (e.g., the charge trap or the floating gate) of the memory cell to program the cell to a particular data state. The stored charge on the charge storage structure of the memory cell can indicate the Vt of the cell. For example, a single level cell (SLC) can be programmed to a targeted one of two different data states, which can be represented by the binary units 1 or 0. Also, some flash memory cells can be programmed to a targeted one of more than two data states. Multilevel cells (MLCs) may be programmed to any one of four data states (e.g., represented by the binary 00, 01, 10, 11) to store two bits of data. Similarly, triple level cells (TLCs) may be programmed to one of eight (i.e., $2^3$) data states to store three bits of data, and quad level cells (QLCs) may be programmed to one of 16 (i.e., $2^4$) data states to store four bits of data.

Such memory cells may be arranged in rows (e.g., each corresponding to a word line 143) and columns (e.g., each corresponding to a bit line). The arrangements can further correspond to different groupings for the memory cells. For example, each word line can correspond to one or more memory pages. Also, the memory array 116 can include memory blocks that each include a set of memory pages. In operation, the data can be written or otherwise programmed (e.g., erased) with regards to the various memory regions of the memory array 116, such as by writing to groups of pages and/or memory blocks. In NAND-based memory, a write operation often includes programming the memory cells in selected memory pages with specific data values (e.g., a string of data bits having a value of either logic 0 or logic 1). An erase operation is similar to a write operation, except that the erase operation re-programs an entire memory block or multiple memory blocks to the same data state (e.g., logic 0).

While the memory array 116 is described with respect to the memory cells, it is understood that the memory array 116 can include other components (not shown). For example, the memory array 116 can also include other circuit components, such as multiplexers, decoders, buffers, read/write drivers, address registers, data out/data in registers, etc., for accessing and/or programming (e.g., writing) the data and for other functionalities.

As described above, the memory system controller 114 can be configured to control the operations of the memory array 116. The memory system controller 114 can include a processor 122, such as a microcontroller, special purpose logic circuitry (e.g., a field programmable gate array (FPGA), an application specific integrated circuit (ASIC), etc.), or other suitable processor. The processor 122 can execute instructions encoded in hardware, firmware, and/or software (e.g., instructions stored in controller embedded memory 124 to execute various processes, logic flows, and routines for controlling operation of the memory system 102 and/or the memory array 116.

In some embodiments, the memory system controller 114 can include a buffer manager 126 configured to control and/or oversee information exchanged with the host device 104. The buffer manager 126 can interact with the host interface 112 regarding operations of receiving and/or transmitting buffers therein.

Further, the memory system controller 114 can further include an array controller 128 that controls or oversees detailed or targeted aspects of operating the memory array 116. For example, the array controller 128 can provide a communication interface between the processor 122 and the memory array 116 (e.g., the components therein). The array controller 128 can function as a multiplexer/demultiplexer, such as for handling transport of data along serial connection to flash devices in the memory array 116.

In controlling the operations of the memory system 102, the memory system controller 114 (via, e.g., the processor 122 and the embedded memory 124) can implement a Flash Translation Layer (FTL) 130. The FTL 130 can include a set of functions or operations that provide translations for the memory array 116 (e.g., the Flash devices therein). For example, the FTL 130 can include the logical-physical address translation, such as by providing the mapping between virtual or logical addresses used by the operating system to the corresponding physical addresses that identify the Flash device and the location therein (e.g., the layer, the page, the block, the row, the column, etc.). Also, the FTL 130 can include a garbage collection function that extracts useful data from partially filed units (e.g., memory blocks) and combines them to a smaller set of memory units. The FTL 130 can include other functions, such as wear-leveling, bad block management, concurrency (e.g., handling concurrent events), page allocation, error correction code (e.g., error recovery), or the like.

The memory system 102 can include a circuit management mechanism 150 (e.g., circuit, software, firmware, or a combination thereof) configured to manage memory circuits according to one or more reliability measures. In some embodiments, the memory system controller 114 can implement the circuit management mechanism 150 by computing one or more reliability measures 152 of the memory cells in the memory array 116. The reliability measures 152 can represent the capacities of the memory cells to store and maintain accurate levels of charges over time.

The memory system 102 can compute the reliability measures 152 using real-time conditions, operations, and/or measurements. In some embodiments, the memory system controller 114 and/or the memory array 116 can compute the reliability measures 152 based performing program-verification operations using strict, controlled, and/or reduced timing windows. For example, the memory system controller 114 and/or the memory array 116 can initiate the reliability measurement process by erasing one or more memory blocks from each die. Following the erase, the memory system controller 114 and/or the memory array 116 can initiate programming of the erased block within a programming start time 162 ($T_{start}$) with a predetermined message and complete the page programming operations within a programming completion time 164 ($T_{complete}$). The memory system controller 114 and/or the memory array 116 can read target sample pages from the programmed block within test read time 166 ($T_{read}$). The memory system controller 114 and/or the memory array 116 can compute the reliability measures 152 based on the corresponding read results, such as using a number of accurately written cells/pages. The programming start time 162, the programming completion time 164, and/or the test read time 166 can be separate from any related standardized or existing timing parameters. For example, the programming start time 162, the programming completion time 164, and/or the test read time 166 can correspond to a stricter or a narrower window than any related performance windows.

Using the reliability measures 152, the memory system 102 can classify the memory cells into different bins 154 that correspond to different operation parameters. In some embodiments, the memory system 102 can include a set of thresholds 156 (e.g., different levels of the reliability measures 152) that define the bins 154. The memory system 102 can use the set of thresholds 156 to categorize or label the tested memory circuits (e.g., pages, blocks, dies/packages, etc.) according to the corresponding reliability measures 152.

The memory system 102 can periodically update the bin classifications during the lifetime thereof. Accordingly, the memory system 102 can dynamically and continuously control the usage and application of the memory cells according to real-time conditions throughout the lifetime. As memory circuits degrade and become less reliable, the memory system 102 can detect memory cells that begin to fall below one or more thresholds and manage them accordingly, such as by changing programming times/pulses, changing refresh frequencies or parameters, and/or retiring and removing from usable storage. Details regarding the circuit management mechanism 150 are described below.

Figure 1B:
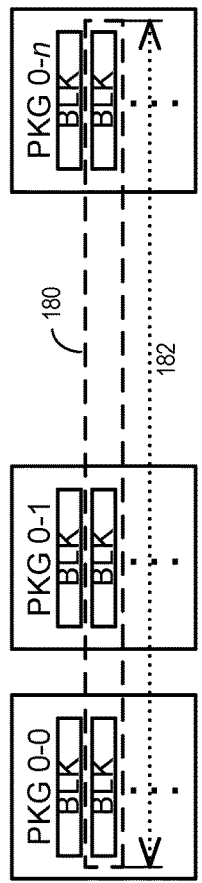
FIG. 1B is a block diagram of a block stripe in accordance with an embodiment of the present technology.

FIG. 1B is a block diagram of a block stripe (BS) 180 (e.g., a collection of memory blocks that are within different memory dies/packages) in accordance with an embodiment of the present technology. In some embodiments, the memory system 102 of FIG. 1A can store related data across multiple dies or packages to increase the data access. In other words, the memory system 102 can group memory blocks that are each in a different die to one BS 180 storing one unit of data, such as write data exceeding a page/block size, data written successively within threshold time from each other, and/or data otherwise linked or related to each other. In comparison to storing the unit of data to memory blocks in one die, the memory system 102 can leverage the independent access circuits in each die of the BS 180 to provide parallel/simultaneous access to the data and/or to reduce the access time for a sequenced read for the related data.

The BS 180 can have a length 182 corresponding to a quantity of the dies included therein. In some embodiments, the memory system 102 can use a predetermined value for the BS length 182. In other embodiments, the memory system 102 can dynamically configure and track the BS length 182. In other words, the BS 180 can be independently configured according to real-time conditions associated with the data stored therein.

The memory system 102 can implement the circuit management mechanism 150 of FIG. 1A along with the BS 180. Details regarding the circuit management mechanism 150 in association with the BS 180 is described below.

Circuit Classification

Figure 2B:
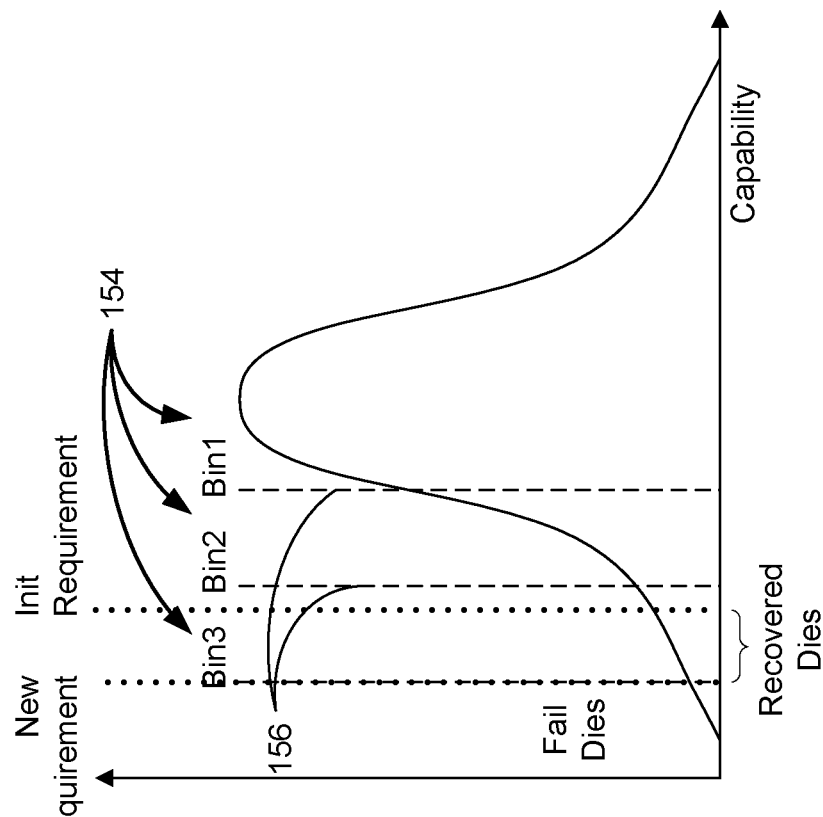
FIG. 2A and FIG. 2B illustrate different requirement schemes for classifying memory circuits for operation in accordance with an embodiment of the present technology.
Figure 2A:
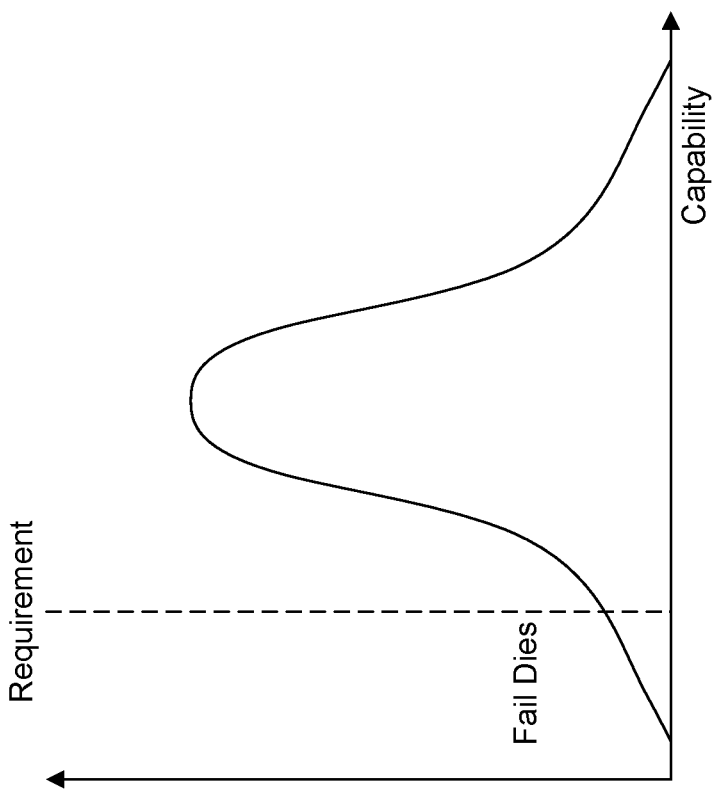

FIG. 2A and FIG. 2B illustrate different requirement schemes for classifying memory circuits for operation in accordance with an embodiment of the present technology. FIG. 2A, for comparison purposes, illustrate an example qualification requirement for conventional memory devices (i.e., without the circuit management mechanism 150 of FIG. 1A). Manufacturing processes can introduce variabilities at various points. As a result, different memory circuits (e.g., packages/dies) can have varying degrees of reliability/capability for storing and maintaining accurate levels of charges over time. For typical manufacturing processes, the number of dies (represented along a vertical direction) having different levels of capability (represented along a horizontal direction) can follow a bell/normal distribution.

The qualification requirement (illustrated using a dashed line in FIG. 2A) can define a pass-fail requirement. In other words, dies failing to meet the qualification requirement can be failed and excluded from subsequent use/assembly (e.g., SSD). The failing dies can correspond to yield loss.

For conventional devices, the qualification requirement can account for future or near-term degradations of dies. For example, the qualification requirement can be greater than a minimum operating capability to include dies that typically or will likely fail in a predetermined period following deployment (e.g., early in lifetime). In other words, the qualification requirement can include dies that may otherwise be used during the lifetime.

FIG. 2B illustrates the different bins 154 and the corresponding thresholds 156 relative to the capability distribution according to the circuit management mechanism 150. The threshold set 156 can correspond to or include a final/lowest capability threshold that represents a new qualification requirement lower than the initial qualification requirement. Accordingly, the circuit management mechanism 150 can increase the number of dies that can be qualified and included in the downstream product. Effectively, the circuit management mechanism 150 can be used to recover dies that would have otherwise failed with the initial requirement (i.e., without the circuit management mechanism 150).

The threshold set 156 can define various categories of operational capability/reliability levels greater than the new qualification requirement. The memory system 102 can use the different categories of circuits differently. For example, the memory system 102 can utilize the memory circuits in the bin (e.g., Bin 1) corresponding to the higher capability more frequently than the ones with lower capability levels. In other words, the memory system 102 can store incoming or refreshed data in the Bin 1 circuits first, use Bin 2 circuits when all Bin 1 circuits are unavailable (e.g., due to usage, operational timing, or other similar offline statuses), use Bin 3 circuits when all Bin 1 and Bin 2 circuits are unavailable, and so forth. For such embodiments, the memory system 102 can effectively use the bin classifications to implement a more accurate or effective wear-leveling across dies, such as for controlling the dies included in the BS 180 of FIG. 1B.

Control Flow and State Transitions

The circuit management mechanism 150 can leverage multiple different controls and adjustments to recover the otherwise failed dies. One example of such control and adjustment is regarding system write cursors. In some embodiments, the memory system 102 can leverage a set of write cursors that include at least a host cursor, a garbage collection (GC) cursor, and an FTL cursor that each identify an open instance of the BS 180 that extend across a set of dies. The memory system 102 can use the host cursor and GC cursor blocks to detect and estimate the reliability measures 152. The memory system 102 can program to the memory circuits associated with the host cursor based on a host workload. Similarly, the GC cursor can identify the target memory circuits for the GC operation that collects valid data from partially filled blocks. The memory system 102 can initiate the GC operation based on analyzing the physical space (e.g., number of blocks) in comparison to the valid data stored therein. The memory system 102 can further analyze the continuing host workload (e.g., writes/ reads for data related to the valid data) in initiating the GC operation. In one or more embodiments, the circuit management mechanism 150 can bypass or ignore the FTL cursor (e.g., SLC cursor).

With the write cursors, the circuit management mechanism 150 can implement the controlled timings, such as the programming start time 162 of FIG. 1A, the programming completion time 164 of FIG. 1A, and/or the test read time 166 of FIG. 1A. In some embodiments, the memory system 102 (via, e.g., the firmware) can be configured to ensure that the erase, program and the read operation are completed in targeted time/duration. To ensure the timing, the circuit management mechanism 150 can address or adjust for the unpredictable aspects (e.g., when the host will write data or how much) associated with the system write cursors. The circuit management mechanism 150 can utilize one or more aspects of the control flows described below to determine the reliability measure 152 and implement the corresponding operational controls.

Figure 3A:
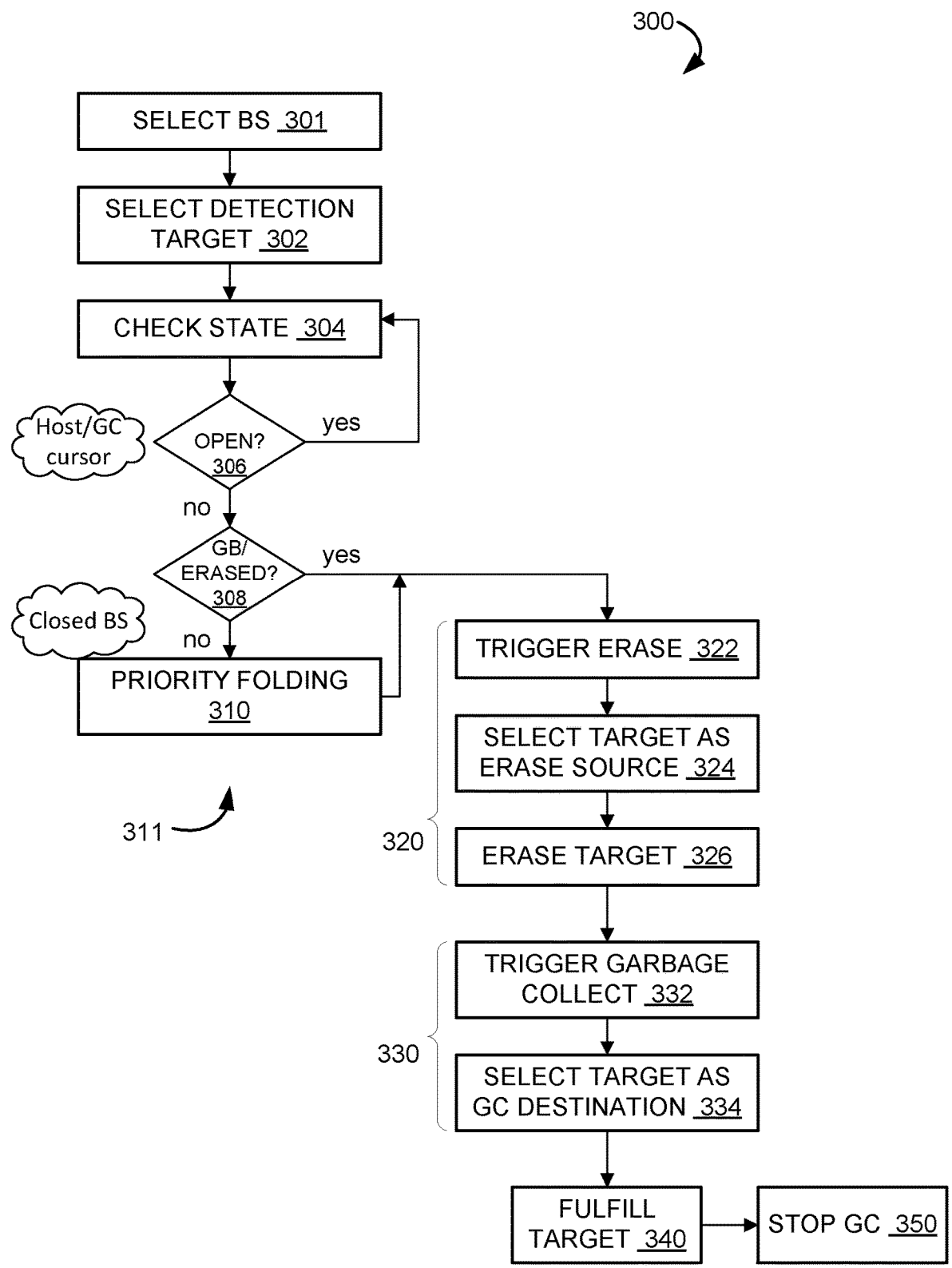
FIG. 3A is a flow diagram illustrating a first example method of operating an apparatus in accordance with an embodiment of the present technology.

FIG. 3A is a flow diagram illustrating a first example method 300 of operating an apparatus (e.g., the memory system 102 of FIG. 1A or one or more components therein) in accordance with an embodiment of the present technology. The method 300 can be for implementing the circuit management mechanism 150 of FIG. 1A. For example, the method 300 can be for implementing the circuit management mechanism 150 based on the GC cursor.

As a high-level illustration, the method 300 can include (1) proactively setting a selected BS as GC cursor block, (2) utilizing the GC process to program data into the selected BS, and (3) performing a detection read to obtain the reliability measure 152. As a more detailed example, at step 301, the memory system 102 can select a BS (e.g., an instance of the BS 180 of FIG. 1B). In some embodiments, the memory system 102 can dynamically select the BS according to a predetermined equation/process. In other embodiments, the memory system 102 can select a predetermined or fixed BS.

Based on the selection, the memory system 102 can free up selected BS as illustrated at operation 311. The memory system 102, via the memory system controller 114 of FIG. 1A and/or the circuit management mechanism 150, can free up by setting the selected block stripe from one or more states to an erased state. In some embodiments, freeing up the selected BS (operation 311) can include a set of steps or sub-operations. For example, at step 302, the memory system 102 can select a detection target for determining the reliability measure 152. At step 304, the memory system 102 can check the current state of the selected target.

When selected BS corresponds to the host cursor or the GC cursor, the host may command a write operation at any/unpredictable time. Thus, the memory system 102 may ignore such BS for the measurement operations. Accordingly, at decision step 306, the memory system 102 can determine whether the current state is open, such as by being associated with host cursor or the GC cursor. When the current state of the selected BS is open (e.g., susceptible to host writes), the memory system 102 can wait until the selected BS transitions to a different state, such as illustrated by a feedback loop to step 304.

At decision step 308, the memory system 102 can determine whether the current state corresponds to GC settings (e.g., in garbage queue) or erased state. When the selected BS has already been erased, the programming time cannot be controlled. As such, the memory system 102 can erase the selected BS again to control the programming timing. Similarly, if the current state of the BS is in garbage queue (e.g., containing garbage data), the selected BS can be ready for the erase operation. Accordingly, when the selected BS corresponds to the GC setting or in an erased state, the memory system 102 can implement a force erase for the selected BS as illustrated in operation 320. Otherwise, when the selected BS is closed (e.g., not associated with GC settings and not already in an erased state), the selected BS can contain some valid data. Accordingly, as illustrated at step 310, the memory system 102 can implement a priority folding operation to move the valid data out of the selected BS and free up the BS. After the priority folding, the memory system 102 can implement the force erase illustrated in operation 320.

In some embodiments, the force erase operation can include a set of sub-operations or steps. For example, at step 322, the memory system 102 can force trigger (e.g., independent of other existing basis, timing, or triggers) the erase operation for the selected BS. At step 324, the memory system 102 can intentionally set the selected BS as the erase source block. At step 326, the memory system 102 can complete the triggered erase operation for the selected BS.

Once the selected BS is erased, the memory system 102 can force trigger the GC process as illustrated at operation 330, such as for programming the targeted/selected BS within a given window. For example, at step 332, the memory system 102 can force trigger the GC process, such as independent of host-write-workload-based triggers. If a host write workload is ongoing, the memory system 102 can trigger the GC according to other normal conditions. At step 334, the memory system 102 can set the selected/targeted BS as the GC destination block.

Based on the triggered GC, the memory system 102 can program the targeted/selected BS as illustrated at operation 340. The memory system 102 can program the pages (e.g., from the first to the last), such as using predetermined data/content. The memory system 102 can use the triggered erase and the triggered GC to eliminate external influences and initiate the programming operation within the programming start time 162 of FIG. 1A and complete the programming operation within the programming completion time 164. In some embodiments, the memory system 102 can stop the force-triggered GC process as illustrated at operation 350.

As described above, the memory system 102 can implement the method 300 to ensure that the selected BS can be immediately operated on without external conditions/influences. Accordingly, the memory system 102 can control the timing parameters.

Figure 3B:
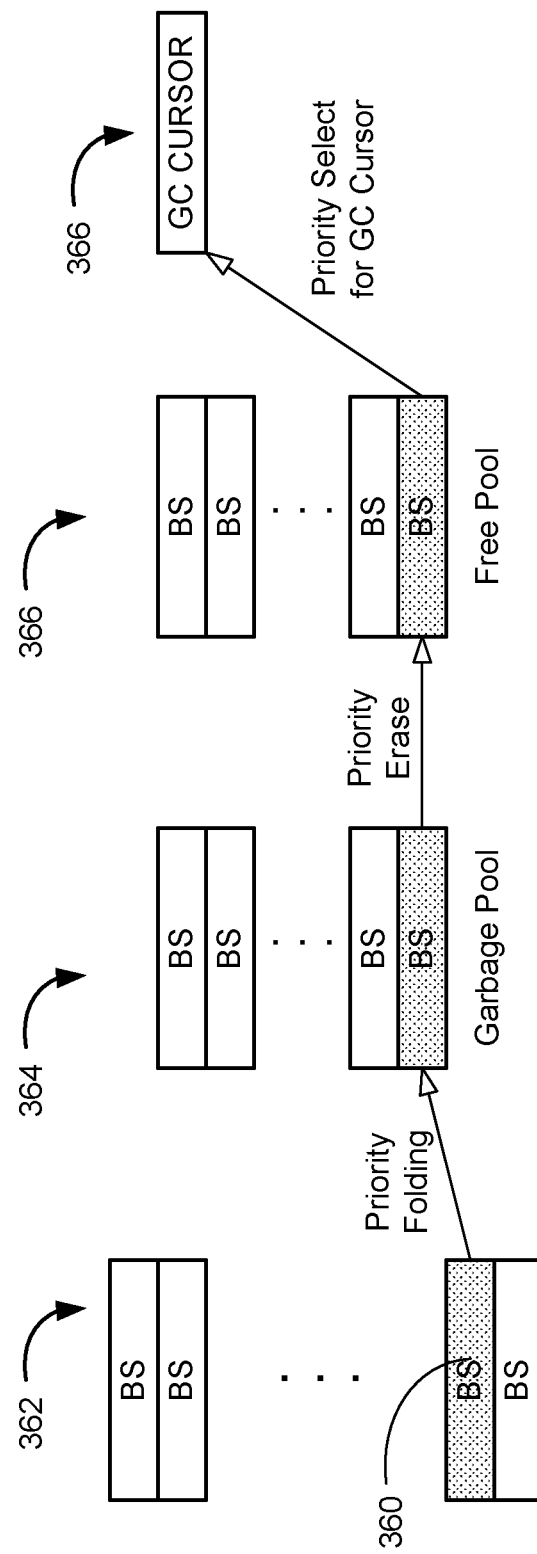
FIG. 3B is an illustration of a first set of state transitions in accordance with an embodiment of the present technology.

FIG. 3B is an illustration of a first set of state transitions in accordance with an embodiment of the present technology. The illustrated state transitions can correspond to the method 300 of FIG. 3A. For example, the memory system 102 can select at step 301 of FIG. 3A a target BS 360, which can be in a closed block pool 362. The memory system 102 can check and compare the corresponding states as described above for step 302-308 of FIG. 3A.

The memory system 102 can implement the priority folding operation as illustrated at step 310 described above to transition the target BS 360 from the closed block pool 362 to a garbage pool 364. The memory system 102 can implement the erase operation 320 to erase the target BS 360, thereby transitioning the corresponding state from the garbage pool 364 to a free pool 366. From the free pool 366, the memory system 102 can force trigger the GC process (operation 340 of FIG. 3A) to transition the target BS 360 to a correspond to a GC cursor 368. Using the GC cursor 368, the memory system 102 can implement the timed programming operation as described above.

Figure 4A:
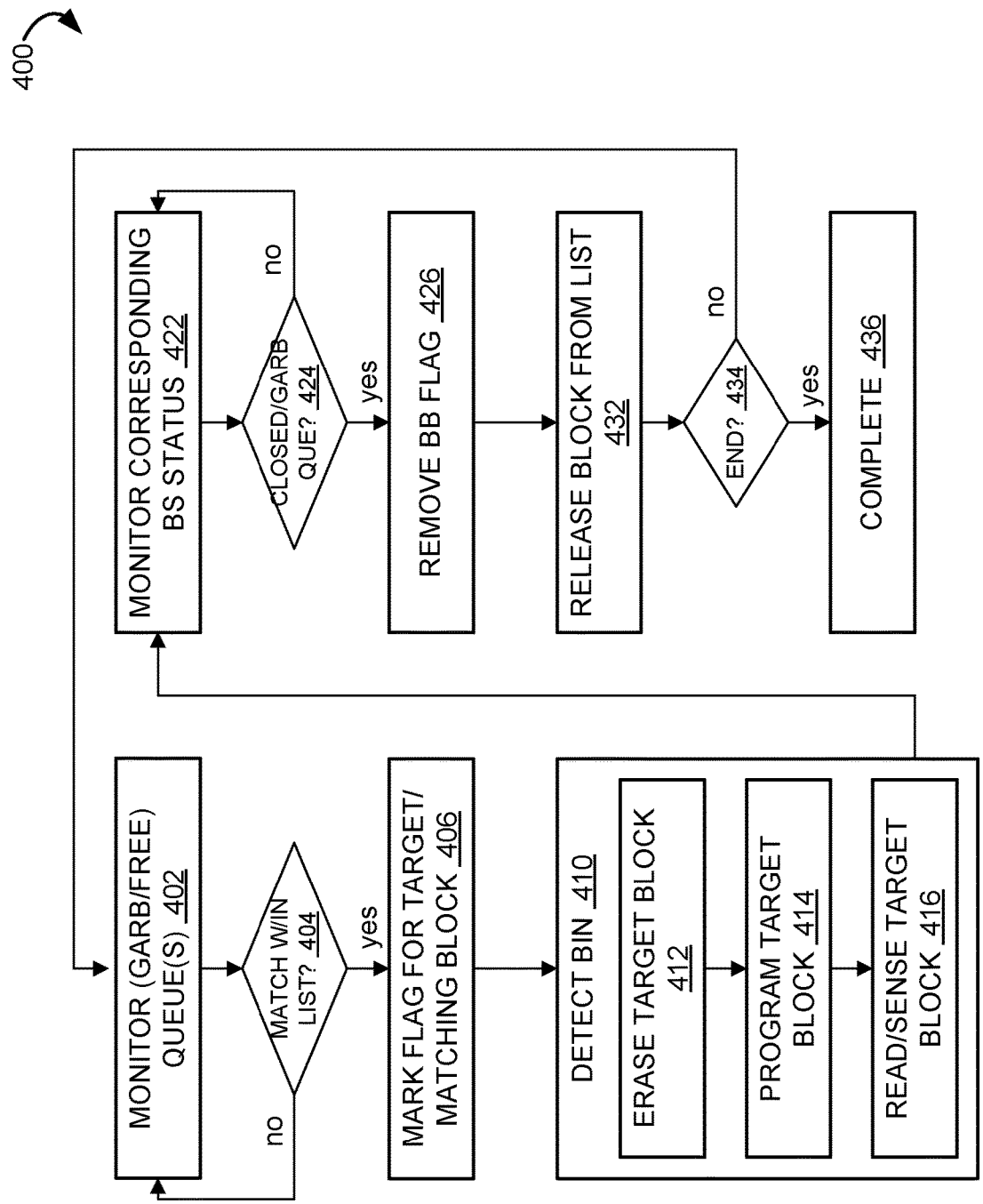
FIG. 4A is a flow diagram illustrating a second example method of operating an apparatus in accordance with an embodiment of the present technology.

FIG. 4A is a flow diagram illustrating a second example method 400 of operating an apparatus (e.g., the memory system 102 of FIG. 1A or one or more components therein) in accordance with an embodiment of the present technology. The method 400 can be for implementing the circuit management mechanism 150 of FIG. 1A. For example, the method 400 can be for implementing the circuit management mechanism 150 based on marking one or more bad blocks and/or suspending BS. The method 400 can include marking a single block as a bad block in certain time frame for detection operation and subsequently release the single block a previously associated BS. As a high-level illustration, the method 400 can include (1) monitoring the BS numbers in garbage queue and/or free queue, (2) marking a bad block based on a list of block numbers, (3) start bin detection for the marked block, and (4) remove the bad block flag, thereby automatically assigning the block back to the originally corresponding BS.

The method 400 can provide flexible block selection and the capability to single out and perform bin detection on one targeted die/block. In contrast, the method 300 of FIG. 3 can provide more efficient bin detection for multiple blocks or the entirety of the blocks/dies in the BS.

Figure 4B:
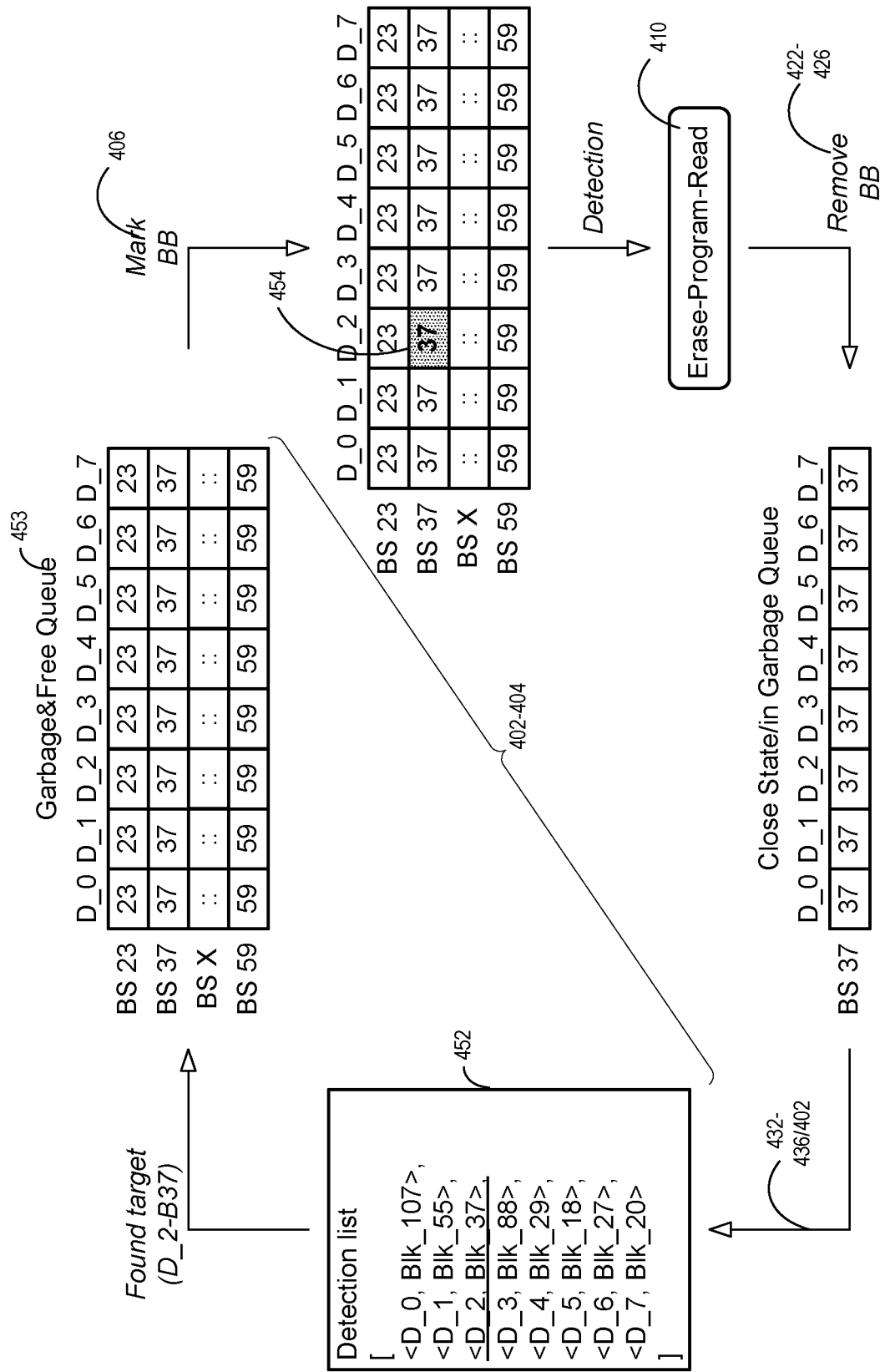
FIG. 4B is an illustration of a second state transition in accordance with an embodiment of the present technology.

For further illustrating the method 400, the memory system 102 can be assumed to contain eight dies in the memory array 116 of FIG. 1A. Further, the memory system 102 can be assumed to follow a linear (e.g., non-diagonal) BS scheme. As such, all single blocks in each BS can have matching physical block numbers. Additionally, the bin detection or the reliability measurement can utilize single block number for each die. For example, Die0 can be measured based on block 107, Die1 based on block 55, Die2 based on block 37, Die3 based on block 88, Die4 based on block 29, and so forth as illustrated in the detection list of FIG. 4B. FIG. 4B is an illustration of a second state transition in accordance with an embodiment of the present technology. The second state transition can follow the method 400 as described below.

At step 402, the memory system 102 (via, e.g., via the memory system controller 114 of FIG. 1A and/or the circuit management mechanism 150) can monitor the BS numbers in garbage queue (e.g., the garbage pool 364 of FIG. 3B) and/or the free queue (e.g., the free pool 366 of FIG. 3B). For example, the memory system 102 can iteratively access the BS number in a garbage and free queue 453 illustrated in FIG. 4B. At decision step 404, the memory system 102 can compare the accessed BS number to block numbers listed in a detection list (e.g., a list 452 illustrated in FIG. 4B listing block numbers, such as 107, 55, 37, etc.). When the accessed BS number does not match a compared block number in the detection list, the memory system 102 can continue to iterate, as illustrated by a feedback loop to step 402. Otherwise, when the BS number matches the block number in the detection list 452, the memory system 102 can mark the corresponding block using a bad block marker 454 as illustrated at step 406. For the example illustrated in FIG. 4B, the memory system 102 can iterate across the garbage & free queue until finding BS 37 that includes block 37 of Die2. Since Die2-Block37 is included in the detection list 454, the memory system 102 can use the bad block marker 454 thereon.

After applying the bad block marker 454, the memory system 102 can detect the bin or determine the reliability measure of the marked block as illustrated at step 410. For example, at sub-step 412, the memory system 102 can erase the target block (e.g., block 37 of Die2) marked with the bad block marker 454. At sub-step 414, the memory system 102 can program the target block. As described above, the memory system 102 can initiate the programming operation within the programming start time 162 of FIG. 1A from the erase operation and complete the programming operation within the programming completion time 164 of FIG. 1A. The memory system 102 can program the target block with predetermined/dummy data. At sub-step 416, the memory system 102 can read or sense the target block. The memory system 102 can read the target block (e.g., one or more predetermined/sample pages therein) within the test read time 166 of FIG. 1A from completion of the programming operation. The memory system 102 can use a difference between the read result and the programmed data to determine the reliability measure 152 of FIG. 1A.

After detecting the bin, the memory system 102 can monitor or check the corresponding BS status as illustrated at step 422 and compare the BS status to see whether the BS originally including the bad block is closed (e.g., in a mode separate from actively programming or from anticipating the programming by the host) or in a garbage queue as illustrated at decision step 424. When the corresponding BS is not closed or not in garbage queue, the memory system 102 can continue to monitor the BS status as illustrated by a feedback loop to step 422. Otherwise, when the corresponding BS is in a closed state or in the garbage queue, the memory system 102 can remove the bad block flag 454 as illustrated at step 426.

After removing the bad block flag 454, the memory system 102 can release the target block (e.g., Die2 block 37) as illustrated at step 432. At step 434, the memory system 102 can determine whether the target block was listed at the end of the garbage queue and/or the free queue. If the target block was not at the end and additional blocks remain for bin detection, the control flow can pass to step 402 to continue the steps described above. Otherwise, when the target block corresponds to the end, the memory system 102 can complete the method 400 as illustrated at step 436.

Figure 5A:
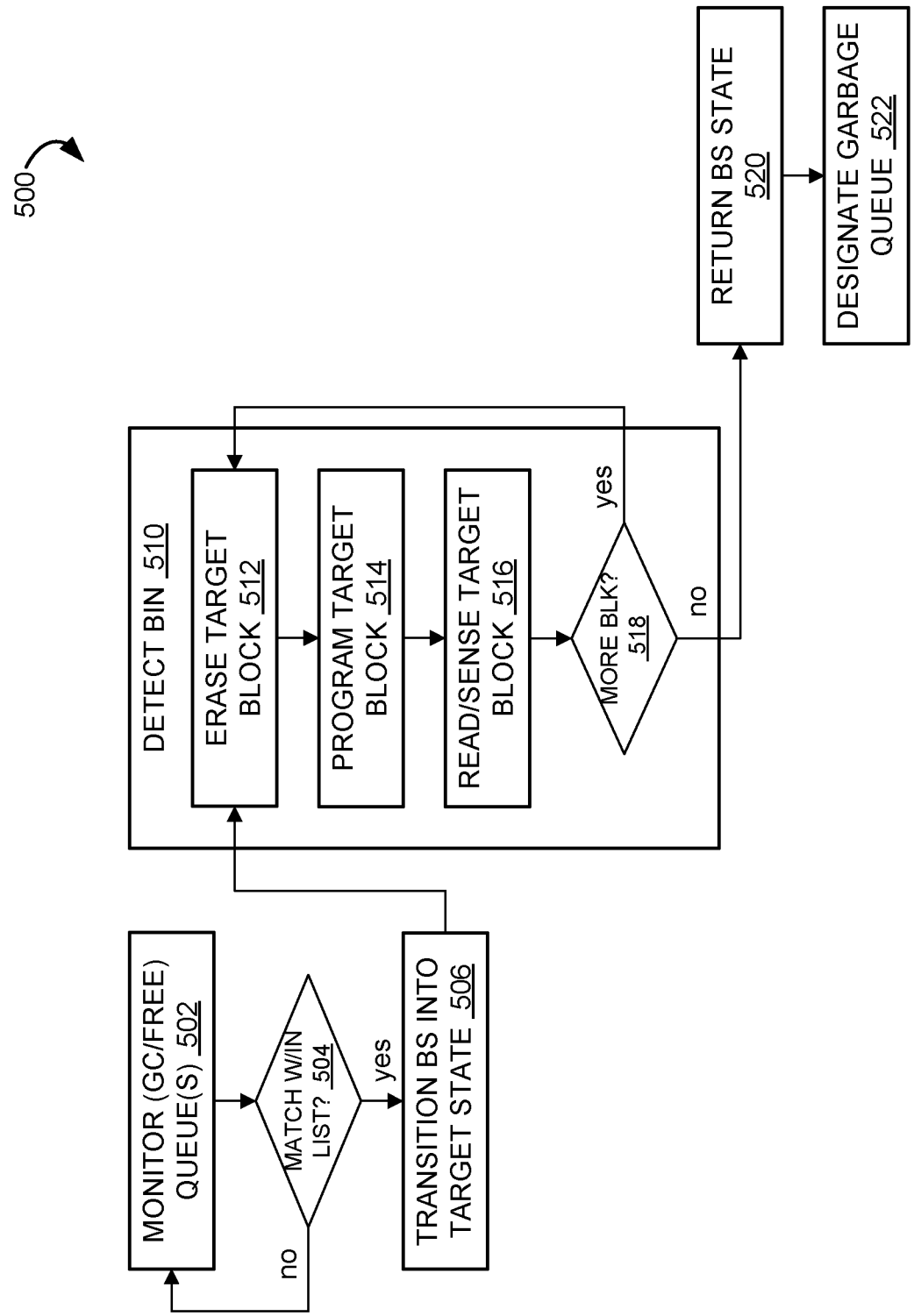
FIG. 5A is a flow diagram illustrating a third example method of operating an apparatus in accordance with an embodiment of the present technology.

FIG. 5A is a flow diagram illustrating a third example method 500 of operating an apparatus (e.g., the memory system 102 of FIG. 1A or one or more components therein) in accordance with an embodiment of the present technology. The method 500 can be for implementing the circuit management mechanism 150 of FIG. 1A. For example, the method 500 can be for implementing the circuit management mechanism 150 based on suspending the BS in special state for bin detection and release it to normal state after completing detection. As a high-level illustration, the method 500 can include (1) monitoring the BS numbers in the garbage queue and/or the free queue, (2) ejecting a matching/target BS from the corresponding queue and transitioning the BS into a special state, (3) start bin detection for the target BS, and (4) restore the state of the target BS and reassign to the previous queue or default to the garbage queue.

The method 500 can provide increased efficiencies when the detection list includes matching detection blocks for multiple BSs or corresponding dies. In some embodiments, the memory system 102 can trigger the method 500 when the detection list includes at least a threshold number of matching block numbers across BSs or corresponding dies.

Figure 5B:
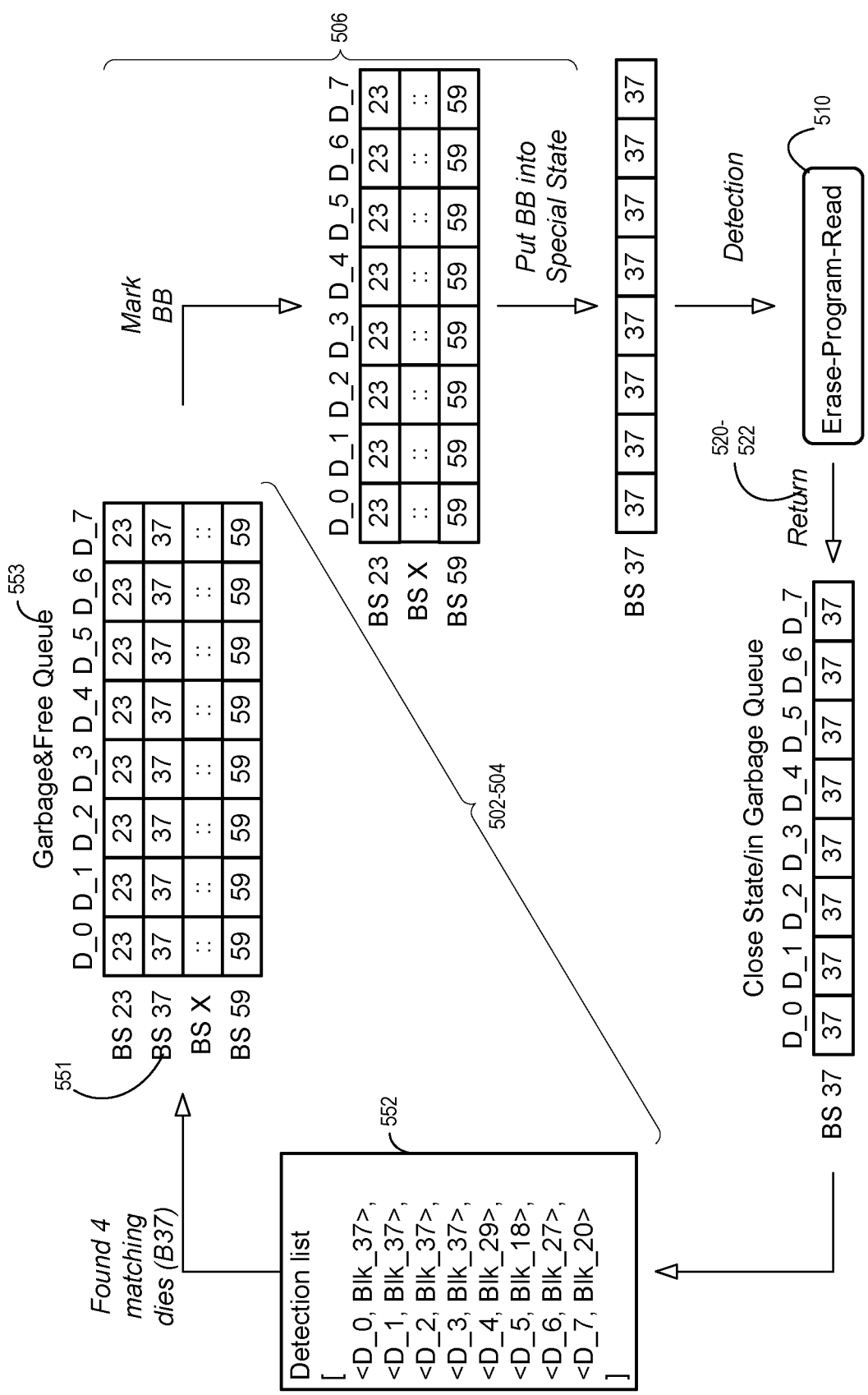
FIG. 5B is an illustration of a third state transition in accordance with an embodiment of the present technology.

For further illustrating the method 500, the memory system 102 can be assumed to have similar traits as described above for method 400. In other words, the illustrative example can correspond to the memory system 102 (1) containing eight dies in the memory array 116 of FIG. 1A, (2) following a linear (e.g., non-diagonal) BS scheme, and (3) utilize a single block number for each die for the bin detection or the reliability measurement can utilize single block number for each die. FIG. 5B is an illustration of a third state transition in accordance with an embodiment of the present technology. The third state transition can follow the method 500 as described below.

At step 502, the memory system 102 (via, e.g., via the memory system controller 114 of FIG. 1A and/or the circuit management mechanism 150) can monitor the BS numbers in garbage queue (e.g., the garbage pool 364 of FIG. 3B) and/or the free queue (e.g., the free pool 366 of FIG. 3B). For example, the memory system 102 can iteratively access the BS number in a garbage and free queue 553 illustrated in FIG. 5B. At decision step 504, the memory system 102 can compare the accessed BS number to block numbers listed in a detection list (e.g., a list 552 illustrated in FIG. 5B listing block numbers, such as 107, 55, 37, etc.). When the block number for the accessed BS does not match a compared block number in the detection list, the memory system 102 can continue to iterate, as illustrated by a feedback loop to step 502. Otherwise, when the BS block number matches a block number in the detection list 552, the memory system 102 can transition a corresponding target BS 551 into a predetermined/special state. Accordingly, the memory system 102 can eject or remove the target BS 551 from the previously corresponding queue (e.g., the garbage and free queue 553). In some embodiments, the memory system 102 can further mark the corresponding blocks as bad blocks using a marker (e.g., the bad block marker 454 of FIG. 4B) in transitioning the target BS 551.

After removing the target BS 551, the memory system 102 can detect the bin or determine the reliability measure of the dies in the target BS 551 as illustrated at step 510. The memory system 102 can implement the bin detection on the dies having blocks identified in the detection list 552 (e.g., dies 0, 1, 2, and 3 for the example illustrated in FIG. 5B). In some embodiments, the memory system 102 can implement the bin detections on the dies in a serial/sequential pattern instead of a simultaneous/parallel pattern.

Similar to step 410, the bin detection step can include multiple sub-steps. For example, at sub-step 512, the memory system 102 can erase the target blocks (e.g., block 37 of dies 0, 1, 2, and 3) in the BS having the special status. At sub-step 514, the memory system 102 can program the target blocks. As described above, the memory system 102 can initiate the programming operation within the programming start time 162 of FIG. 1A from the erase operation and complete the programming operation within the programming completion time 164 of FIG. 1A. The memory system 102 can program each of the target blocks with predetermined/dummy data. At sub-step 516, the memory system 102 can read or sense the target blocks. The memory system 102 can read each of the target blocks (e.g., one or more predetermined/sample pages therein) within the test read time 166 of FIG. 1A from completion of the programming operation. The memory system 102 can use a difference between the read result and the programmed data to determine the reliability measure 152 of FIG. 1A for each of the corresponding blocks/dies. At decision block 518, the memory system 102 can determine whether more blocks require the bin detection process. If additional blocks from the matching set remain (e.g., from the set of block 37 in dies 0, 1, 2, and 3), the memory system 102 can continue to erase, program and read the targeted blocks as illustrated by the feedback loop to step 512.

After the bin detection process, the memory system 102 can restore the status of the target BS 551 as illustrated at step 520. The memory system 102 can remove the special status of the target BS 551 can include in the garbage pool or the free pool. In some embodiments, the memory system 102 can default to including the target BS 551 into the garbage pool after the bin detection as illustrated at step 522.

Figure 6A:
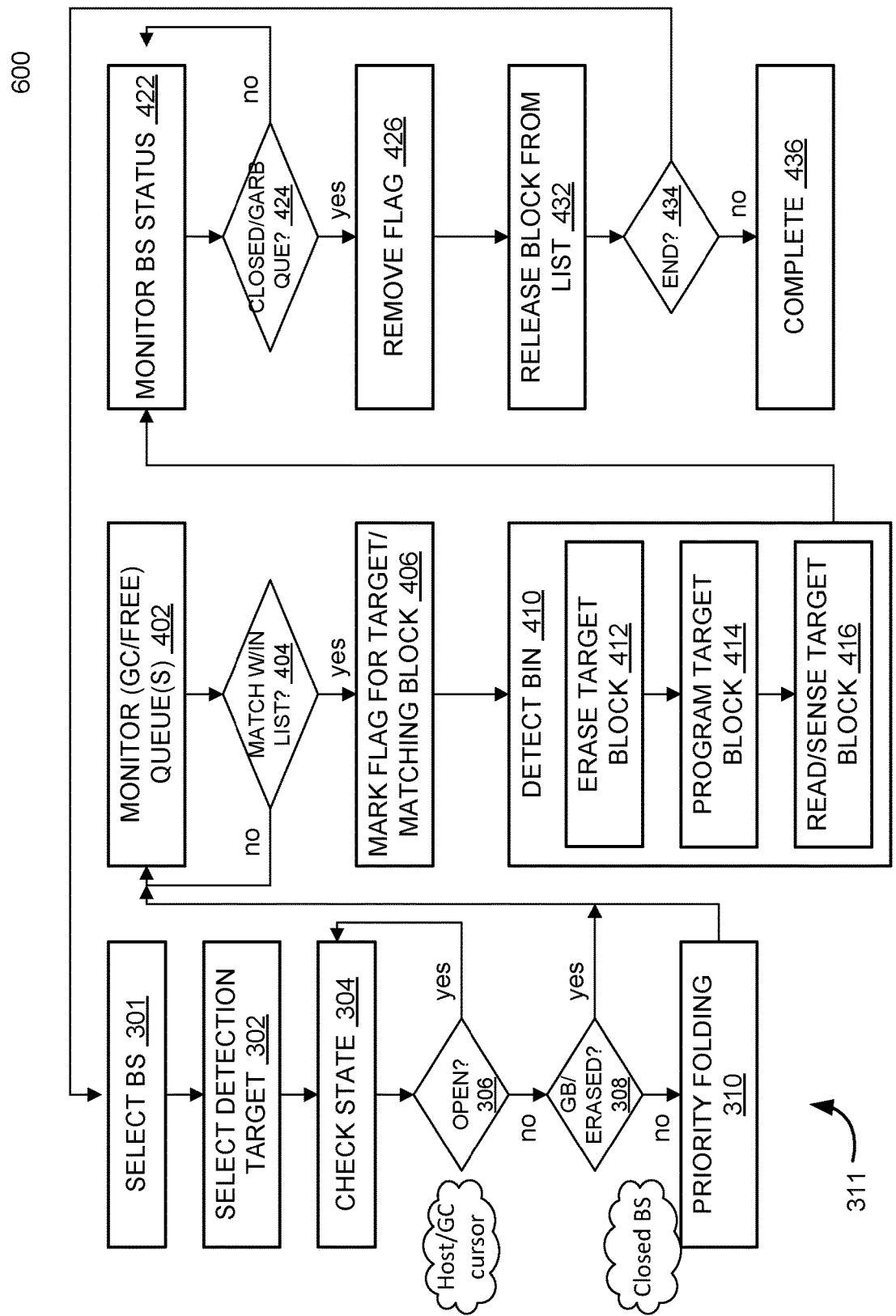
FIG. 6A is a flow diagram illustrating a fourth example method of operating an apparatus in accordance with an embodiment of the present technology.
Figure 6B:
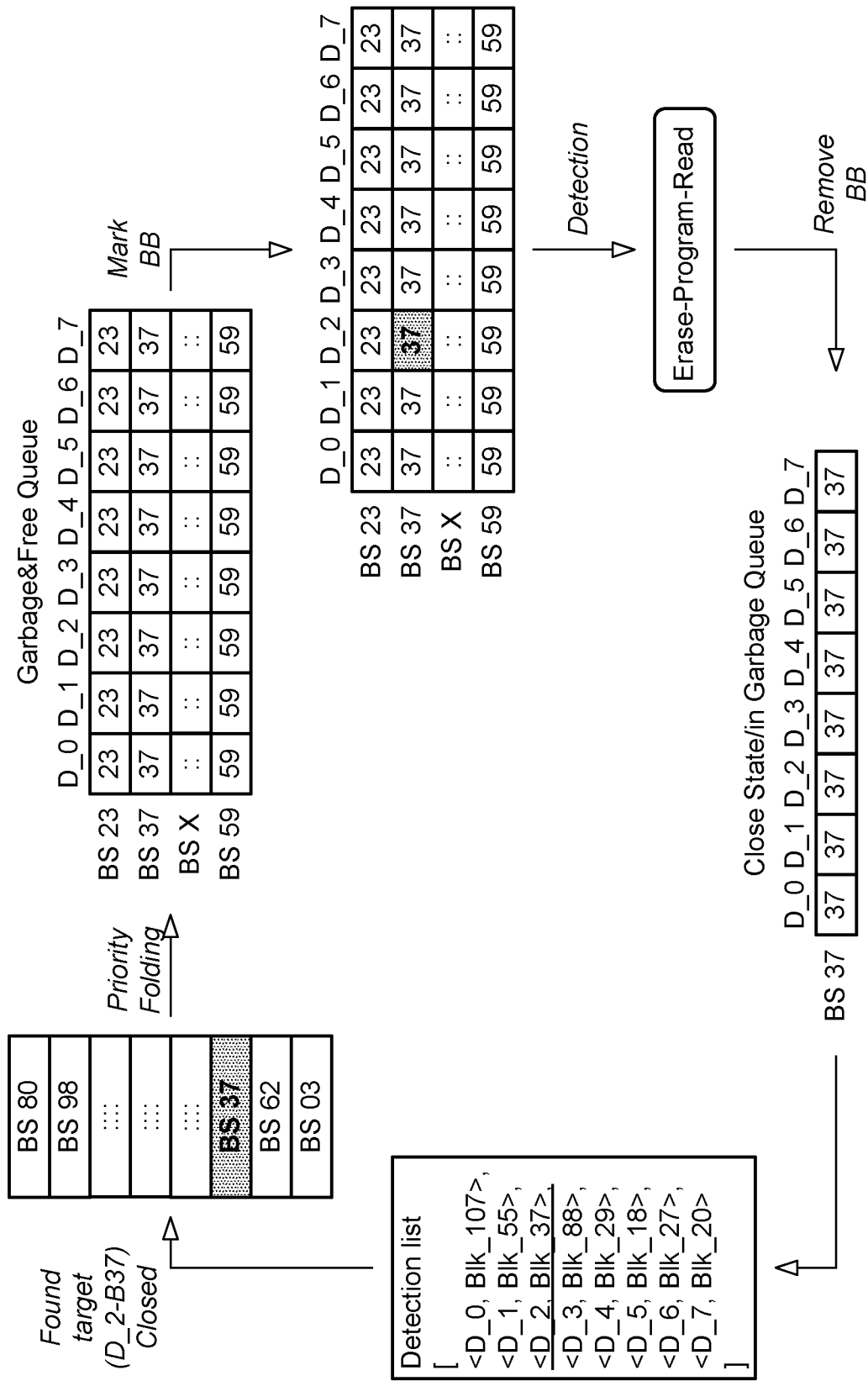
FIG. 6B is an illustration of a fourth state transition in accordance with an embodiment of the present technology.

FIG. 6A is a flow diagram illustrating a fourth example method 600 of operating an apparatus (e.g., the memory system 102 of FIG. 1A or one or more components therein) in accordance with an embodiment of the present technology. FIG. 6B is an illustration of a fourth state transition in accordance with an embodiment of the present technology. The fourth state transition corresponds to the method 600.

The method 600 can be for implementing the circuit management mechanism 150 of FIG. 1A. For example, the method 600 can be for implementing the circuit management mechanism 150 based on combining one or more aspects of the method 300 of FIG. 3A within one or more aspects of the method 400 of FIG. 4A. As a high-level illustration, the method 600 can include (1) selecting one block from a detection list, (2) checking the corresponding BS state, (3) selectively implement priority folding based on the BS state, (4) start bin detection process, (5) monitor the BS status for closed/garbage queue, (6) remove bad block flag for the targeted block, (7) release the targeted block, and (8) repeat for other blocks in the detection list.

The method 600 can allow the memory system 102 to proactively control which BS will be assigned to garbage queue or free queue. Accordingly, the memory system 102 can address cold data or reduce the time a selected block waits for the bin detection process and/or a static wear leveling process.

For the proactive control, the method 600 can include the operation 311 to free up the selected BS. For example, the method 600 can include selecting a BS at step 301, selecting a detection target at step 302, and checking the state of the selected target at step 304 as described above. The method 600 can further include determining whether the current state is open at decision step 306 and determining whether the current state corresponds to GC settings (e.g., in garbage queue) or erased state at decision at decision step 308. For closed BS that are not open and not in garbage pool nor in erased state, the memory system 102 can implement the priority folding operation at step 310.

Once the selected BS has been freed (e.g., when closed and in garbage pool or in erased state or following the priority folding), the method 600 can incorporate one or more aspects of the method 400. For example, the memory system 102 can monitor the BS numbers in garbage queue and/or the free queue until a block therein matches one of the blocks in the detection list as illustrated at steps 402 and 404. The memory system 102 can use the bad block marker 454 of FIG. 4B to can mark the corresponding block using a bad block marker 454 as illustrated at step 406.

The memory system 102 can implement the bin detection for the marked bad block as illustrated in step 410, such as through erasing, programming and reading the target block as shown in steps 412-416. After the bin detection and the corresponding determination of the reliability measure 152, the memory system 102 can monitor the BS status until the target BS is closed or in the garbage queue as illustrated at steps 422-424. Once the target BS is in the closed state or in the garbage queue, the memory system 102 can remove the flag (e.g., the bad block marker 454) and release the block from the detection list as illustrated at steps 426 and 432. The method 600 can repeat these steps until reaching the end of the detection list as illustrated in decision step 434 and the corresponding feedback loop.

Overall System

Figure 7:
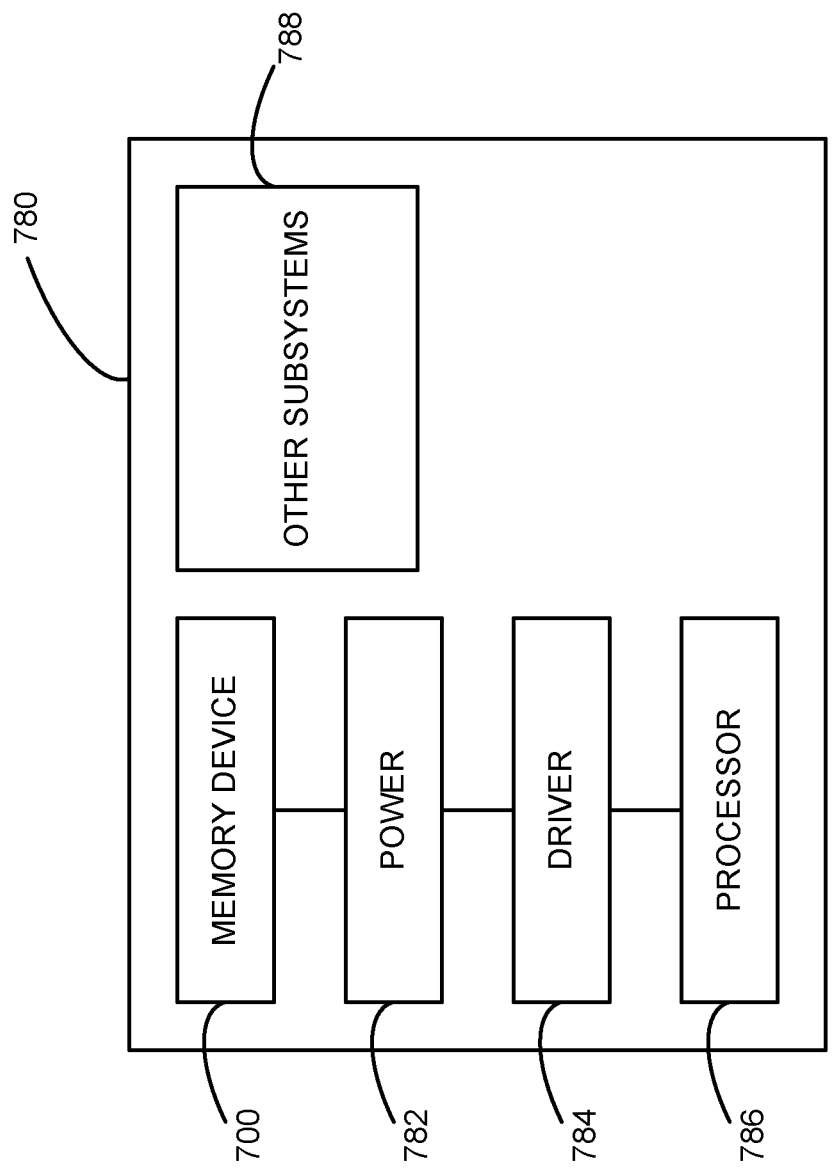
FIG. 7 is a schematic view of a system that includes an apparatus in accordance with an embodiment of the present technology.

FIG. 7 is a schematic view of a system that includes an apparatus in accordance with embodiments of the present technology. Any one of the foregoing apparatuses (e.g., memory devices) described above with reference to FIGS. 1A-6B can be incorporated into any of a myriad of larger and/or more complex systems, a representative example of which is system 780 shown schematically in FIG. 7. The system 780 can include a memory device 700, a power source 782, a driver 784, a processor 786, and/or other subsystems or components 788. The memory device 700 can include features generally similar to those of the apparatus described above with reference to one or more of the FIGS, and can therefore include various features for performing a direct read request from a host device. The resulting system 780 can perform any of a wide variety of functions, such as memory storage, data processing, and/or other suitable functions. Accordingly, representative systems 780 can include, without limitation, hand-held devices (e.g., mobile phones, tablets, digital readers, and digital audio players), computers, vehicles, appliances and other products. Components of the system 780 may be housed in a single unit or distributed over multiple, interconnected units (e.g., through a communications network). The components of the system 780 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of NAND Flash devices. Apparatuses configured in accordance with other embodiments of the present technology, however, can include other types of suitable storage media in addition to or in lieu of NAND Flash devices, such as, devices incorporating NOR-based non-volatile storage media (e.g., NAND flash), magnetic storage media, phase-change storage media, ferroelectric storage media, dynamic random access memory (DRAM) devices, etc.

The term "processing" as used herein includes manipulating signals and data, such as writing or programming, reading, erasing, refreshing, adjusting or changing values, calculating results, executing instructions, assembling, transferring, and/or manipulating data structures. The term data structure includes information arranged as bits, words or code-words, blocks, files, input data, system-generated data, such as calculated or generated data, and program data. Further, the term "dynamic" as used herein describes processes, functions, actions or implementation occurring during operation, usage, or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to one or more of the FIGS. described above.

I claim:

1. A memory device, comprising:
    a memory array including multiple dies each having rewritable memory cells configured to store data; and
    a memory controller operably coupled to the memory array and configured to:
        group memory blocks in different dies into a block stripe (BS) configured to store a set of related data, wherein different portions of the set of related data are stored across the different dies to leverage independent access circuits within the different dies and decrease an overall access time for the set of related data;

access the BS or a targeted memory block therein using a host write cursor and/or a garbage collection (GC) cursor;

track a detection list that identifies dies, blocks, block stripes, or a combination thereof targeted for the reliability measurement;

determine a reliability measure for a die in the memory array based on implementing a set of memory operations involving the die according to a predetermined schedule, wherein the reliability measure represents a capability of the die or a set of memory cells therein to store and maintain accurate levels of charges over time to accurately retain the stored data, wherein the reliability measure is determined based on:

using the host write cursor and/or the GC cursor according to the detection list in determining the reliability measure;

transitioning a selected BS that is in a garbage queue and/or a free queue into a target state when a set of blocks in the selected BS correspond to one or more block identifiers specified in the detection list;

iteratively implementing a following set of operations across in the set of blocks to determine the reliability measure corresponding to each block:

erasing a target memory block within the die;

initiating a programming operation at the target memory block with predetermined data within a programming start time from the erase operation;

completing the programming operation within a programming completion time;

reading the target memory block within a test read time from completing the programming operation;

returning the selected BS to an original state after implementing the read operation; and computing the reliability measure according to a difference between the predetermined programming data and a result of the read operation;

identify a bin categorization for the die based on the determined reliability measure; and adjust operation of the die according to the bin categorization.

2. The memory device of claim 1, wherein the memory controller is configured to:

track a number of program-erase (P/E) cycles performed at the die or a targeted portion thereof during a lifetime of the memory device;

determine the reliability measure when the number of P/E cycles meets or exceeds a trigger threshold; and update the bin categorization for the die based on the reliability measure.

3. The memory device of claim 1, wherein the memory controller is configured to:

identify the bin categorization based on selecting one of at least two bins that each correspond to a unique range of reliability measures; and when the identified bin categorization corresponds to a lesser reliability range, adjust the operation of the die by reducing memory operations performed at the die in comparison to other dies identified with a different bin categorization associated with a greater reliability range.

4. The memory device of claim 3, wherein the at least two bins cover a reliability range adapted for real-time operational adjustments over a lifetime of the memory and extends below a reliability requirement configured for fixed operation schemes without the real-time operational adjustments.

5. The memory device of claim 1, wherein the memory controller is configured to determine the reliability measure based on:

proactively setting the GC cursor or the host write cursor to a selected BS; and determine the reliability measure based on utilizing a GC process to program data into the selected BS, wherein the GC process is configured to aggregate valid data from a number of blocks into a smaller number of blocks.

6. The memory device of claim 5, wherein the memory controller is configured to implement priority folding to move valid data out from the selected BS and free up the selected BS when the selected block is closed without being erased or set to garbage pool, wherein the priority folding is implemented before erasing the selected BS.

7. The memory device of claim 1, wherein the memory controller is configured to determine the reliability measure based on marking one or more bad blocks by:

marking a block within a selected BS that is in a garbage queue and/or a free queue, wherein the block is marked (1) using a bad block marker and (2) when the queued block matches a specified block in the detection list;

implementing the erase, the programing, and the read operations for the marked block to determine the reliability measure;

removing the bad block marker from the block; and releasing the block to the selected BS after implementing the read operation.

8. The memory device of claim 7, wherein the memory controller is configured to:

monitor a status of the selected BS after the read operation; and remove the bad block marker and release the block when the status of the selected BS is closed or indicates association with a garbage queue.

9. The memory device of claim 1, wherein the memory controller is configured to return the selected BS to the garbage queue as a default after implementing the read operation.

10. The memory device of claim 1, wherein the memory controller is configured to:

ensure that a selected BS is freed up for determining the reliability measure;

mark a block within the selected BS that is in a garbage queue and/or a free queue, wherein the block is marked (1) using a bad block marker and (2) when the queued block matches a specified block in the detection list;

implementing the erase, the programing, and the read operations for the marked block to determine the reliability measure;

removing the bad block marker from the block; and releasing the block to the selected BS after implementing the read operation.

11. The memory device of claim 1, wherein the memory device comprises a Solid-State Drive (SSD) and the multiple dies includes recovered dies having reliability measures below a requirement used for dies that operate without the real-time operational adjustments.

12. A method of operating a memory device that includes multiple dies that are each configured to store data, the method comprising:

grouping memory blocks in different dies into a block stripe (BS) configured to store a set of related data, wherein different portions of the set of related data are stored across the different dies to leverage independent access circuits within the different dies and decrease an overall access time for the set of related data;

accessing the BS or a targeted memory block therein using a host write cursor and/or a garbage collection (GC) cursor;

tracking a detection list that identifies dies, blocks, block stripes, or a combination thereof targeted for the reliability measurement;

determining a reliability measure for a die in the memory array based on implementing a set of memory operations involving the die according to a predetermined schedule, wherein the reliability measure represents a capability of the die or a set of memory cells therein to store and maintain accurate levels of charges over time to accurately retain the stored data, wherein the reliability measure is determined based on:

using the host write cursor and/or the GC cursor according to the detection list in determining the reliability measure;

transitioning a selected BS that is in a garbage queue and/or a free queue into a target state when a set of blocks in the selected BS correspond to one or more block identifiers specified in the detection list;

iteratively implementing a following set of operations across in the set of blocks to determine the reliability measure corresponding to each block:

erasing a target memory block within the die;

initiating a programming operation at the target memory block with predetermined data within a programming start time from the erase operation;

completing the programming operation within a programming completion time;

reading the target memory block within a test read time from completing the programming operation;

returning the selected BS to an original state after implementing the read operation;

computing the reliability measure according to a difference between the predetermined programming data and a result of the read operation;

identifying a bin categorization for the die based on the determined reliability measure; and adjusting operation of the die according to the bin categorization.

13. The method of claim 12, further comprising:

tracking a number of program-erase (P/E) cycles performed at the die or a targeted portion thereof during a lifetime of the memory device;

wherein:

the reliability measure is determined when the number of P/E cycles meets or exceeds a trigger threshold; and identifying the bin categorization includes adjusting the bin categorization for the die during the lifetime based on the reliability measure.

14. The method of claim 12, wherein:

the bin categorization is identified based on selecting one of at least two bins that each correspond to a unique range of reliability measures; and the operation of the die is adjusted when the identified bin categorization corresponds to a lesser reliability range, wherein the adjusted operation corresponds to reducing memory operations performed at the die in comparison to other dies identified with a different bin categorization associated with a greater reliability range.

15. A persistent memory device, comprising:

a memory array including multiple dies each having rewritable memory cells that are organized into memory blocks configured to store data; and a memory controller operably coupled to the memory array and configured to:

group memory blocks in different dies into a block stripe (BS) configured to store a set of related data, wherein different portions of the set of related data are stored across a set of memory blocks that are each in a different die;

access the BS or a targeted memory block therein using a host write cursor and/or a garbage collection (GC) cursor;

track a detection list that identifies dies, blocks, block stripes, or a combination thereof targeted for the reliability measurement;

determine a reliability measure for one or more dies used for the BS, the reliability measure representing capabilities of the one or more dies or portions therein to store and maintain accurate levels of charges over time, wherein determining the reliability measure includes:

using the host write cursor and/or the GC cursor according to the detection list in determining the reliability measure;

transitioning a selected BS that is in a garbage queue and/or a free queue into a target state when a set of blocks in the selected BS correspond to one or more block identifiers specified in the detection list;

iteratively implementing a following set of operations across in the set of blocks to determine the reliability measure corresponding to each block:

erasing a target memory block within the die;

initiating a programming operation at the target memory block with predetermined data within a programming start time from the erase operation;

completing the programming operation within a programming completion time;

reading the target memory block within a test read time from completing the programming operation;

returning the selected BS to an original state after implementing the read operation; and computing the reliability measure according to a difference between the predetermined programming data and a result of the read operation;

identify a bin categorization for each of the one or more dies based on the corresponding reliability measure; and adjust operation of the one or more dies according to the corresponding bin categorizations.

16. The persistent memory device of claim 15, wherein memory controller is configured to:

track a number of program-erase (P/E) cycles performed at the BS, the one or more dies therein, or a targeted portion thereof during a lifetime of the memory device;

determine the reliability measure when the number of P/E cycles meets or exceeds a trigger threshold; and update the bin categorization for each of the one or more dies based on the corresponding reliability measure.

* * * * *